US010762939B2

(12) United States Patent
Larsen et al.

(10) Patent No.: US 10,762,939 B2
(45) Date of Patent: Sep. 1, 2020

(54) COMPUTER MEMORY

(71) Applicant: Intel Corporation, Santa Clara, CA (US)

(72) Inventors: Christopher J. Larsen, Boise, ID (US); David A. Daycock, Boise, ID (US); Qian Tao, Boise, ID (US); Saniya Rathod, Boise, ID (US); Devesh K. Datta, Singapore (SG); Srivardhan Gowda, Boise, ID (US); Rithu K. Bhonsle, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/640,530

(22) Filed: Jul. 1, 2017

(65) Prior Publication Data

US 2019/0005996 A1  Jan. 3, 2019

(51) Int. Cl.
| | | |
|---|---|---|
| *G11C 11/34* | (2006.01) |
| *G11C 8/12* | (2006.01) |
| *G06F 3/06* | (2006.01) |
| *G06F 12/02* | (2006.01) |
| *G11C 16/06* | (2006.01) |
| *G11C 19/28* | (2006.01) |
| *H01L 27/11582* | (2017.01) |
| *G11C 5/02* | (2006.01) |
| *G11C 16/04* | (2006.01) |

(52) U.S. Cl.
CPC .............. *G11C 8/12* (2013.01); *G06F 3/0644* (2013.01); *G06F 3/0668* (2013.01); *G06F 12/0223* (2013.01); *G11C 16/06* (2013.01); *G11C 19/28* (2013.01); *H01L 27/11582* (2013.01); *G11C 5/025* (2013.01); *G11C 16/0483* (2013.01)

(58) Field of Classification Search
CPC ... G11C 16/08; G11C 16/10; H01L 27/11556; H01L 27/11524; H01L 21/02244
USPC ..................................... 365/185.11
See application file for complete search history.

(56) References Cited

U.S. PATENT DOCUMENTS

| | | | | |
|---|---|---|---|---|
| 5,671,120 A * | 9/1997 | Kikinisi | ................. | G06F 1/181 165/46 |
| 6,429,068 B1 * | 8/2002 | Divakaruni | ....... | H01L 27/10891 257/E21.652 |
| 8,633,535 B2 * | 1/2014 | Matsuo | ............... | H01L 29/7926 257/324 |
| 8,872,159 B2 * | 10/2014 | Kub | ...................... | H01L 27/148 257/21 |
| 8,927,379 B2 * | 1/2015 | Adkisson | .......... | H01L 29/66242 438/309 |

(Continued)

*Primary Examiner* — Huan Hoang
*Assistant Examiner* — Minh Dinh
(74) *Attorney, Agent, or Firm* — Alliance IP, LLC

(57) ABSTRACT

Computer memory technology is disclosed. In one example, a method for isolating computer memory blocks in a memory array from one another can include forming an opening between adjacent blocks of memory structures. The method can also include forming a protective liner layer on at least the memory structures. The method can further include disposing isolating material in the opening and on the protective liner layer. The method can even further include removing the isolating material on the protective liner layer. The method can additionally include removing the protective liner layer on the memory structures. Associated devices and systems are also disclosed.

30 Claims, 5 Drawing Sheets

(56) References Cited

U.S. PATENT DOCUMENTS

| | | | |
|---|---|---|---|
| 9,716,101 B2* | 7/2017 | Lu | H01L 27/1157 |
| 2012/0007167 A1* | 1/2012 | Hung | H01L 27/0688 |
| | | | 257/324 |
| 2013/0277730 A1* | 10/2013 | Jung | H01L 21/764 |
| | | | 257/316 |
| 2014/0179102 A1* | 6/2014 | Joung | H01L 21/764 |
| | | | 438/666 |
| 2015/0206961 A1* | 7/2015 | Adkisson | H01L 29/66924 |
| | | | 257/24 |
| 2015/0243885 A1* | 8/2015 | Sciarrillo | H01L 27/2454 |
| | | | 257/2 |
| 2016/0091713 A1* | 3/2016 | Sasagawa | G02B 26/02 |
| | | | 345/206 |
| 2016/0149002 A1* | 5/2016 | Sharangpani | H01L 29/1054 |
| | | | 257/314 |
| 2016/0307758 A1* | 10/2016 | Li | H01L 21/02167 |
| 2016/0358855 A1* | 12/2016 | Oh | H01L 23/5226 |
| 2016/0365438 A1* | 12/2016 | Takashima | H01L 29/7802 |
| 2017/0271264 A1* | 9/2017 | Lee | H01L 23/49827 |
| 2017/0309634 A1* | 10/2017 | Noguchi | H01L 27/11519 |
| 2018/0122906 A1* | 5/2018 | Yu | H01L 27/11565 |
| 2018/0315607 A1* | 11/2018 | Sharma | H01L 29/785 |

* cited by examiner

COMPUTER MEMORY

TECHNICAL FIELD

Embodiments described herein relate generally to computer memory devices, and more particularly to isolating computer memory blocks in a memory array from one another.

BACKGROUND

There are many different types of computer memory devices including random-access memory (RAM), read-only memory (ROM), synchronous dynamic random-access memory (SDRAM), dynamic random-access memory (DRAM), and non-volatile memory. In non-volatile memory (e.g., NAND flash memory), one way to increase memory density is by using a vertical memory array, which is also referred to as a three-dimensional (3-D) array.

Some vertical memory arrays include layers of conductive material (separated by layers of insulating material) that are used to provide electrical connections (e.g., word lines) so that memory cells in the array may be selected for writing or reading functions. These electrical connections with the conductive layers are made in a "staircase" region, which typically resides adjacent to the memory cell region. Memory cells and associated staircase regions are separated into independently accessible memory "blocks", for example, by forming slits through the conductive and insulating layers and filling the slits with a suitable isolating material (e.g., an electrically insulative oxide material).

During the process of forming independent memory blocks, however, the tops of the memory structures (e.g., memory pillars and associated memory cells) may be damaged, for example, due to contamination from the isolating material used to fill in the slits. Typically, the isolating material is disposed across the entire memory array, thus being disposed on memory cell regions and staircase regions alike. As a result, contacts in the staircase regions may also be negatively impacted by the isolating material.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Figure 1:
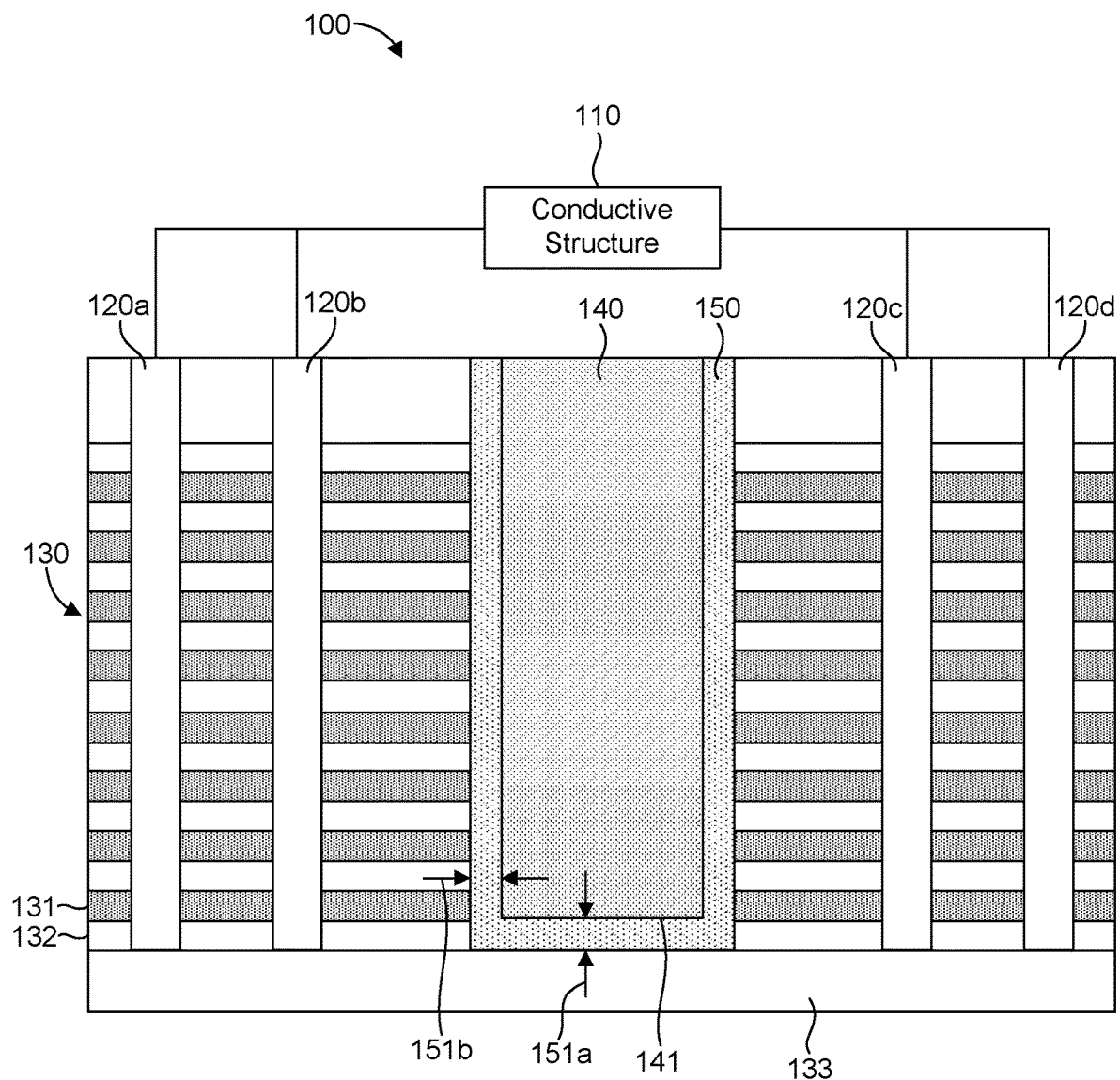
FIG. 1 illustrates a schematic representation of a side view of a computer memory device in accordance with an example.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" provide express support for plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" objects, elements, or structures are in physical contact with one another. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

As mentioned above, memory structures and the staircase regions may be damaged or negatively impacted by the isolating material that fills in the slits and separates the memory blocks. To prevent this, temporary protective barriers or liners may be utilized to protect the memory structures and staircase region. Such protective barriers or liners are removed, to the extent possible, over the memory structures and staircase region prior to making electrical contacts. It is desirable for the protective liner to be as thick as possible over the memory structures due to diffusion of the isolating material through the protective liner, although remaining protective liner material may interfere with electrical performance of the memory structures. On the other hand, it is desirable to minimize the thickness of the protective liner over the staircase region because remaining protective liner material can interfere with the formation of contacts.

Traditionally, multiple protective liner layers have been formed to address these competing objectives of protecting the memory structures and mitigating the contact block issue in the staircase region. For example, a first protective liner layer may be disposed on the memory cell and staircase regions, and then removed from the memory structures and staircase regions. This is followed by a second protective liner layer disposed on the memory cell and staircase regions. The slits are then filled with isolating material, which also covers the memory structures and staircase regions. Although the isolating material is removed from the memory structures and staircase regions, protective liner material still remains to a certain extent that causes electrical problems for the memory structures and blocks contact formation in the staircase regions. The multiple layers of protective liner approach has very small process margin and can still cause electrical issues for the memory structures in addition to requiring further steps to remedy the contact block issue in the staircase region.

Accordingly, a method for isolating computer memory blocks in a memory array from one another is disclosed that provides protection for memory structures while avoiding the contact block issue in the staircase regions. In one aspect, the method eliminates the removal of protective liner material prior to filling the slot with isolating material, and the formation of a second protective liner layer. In one example, a method for isolating computer memory blocks in a memory array from one another comprises forming an opening between adjacent blocks of memory structures. The method also comprises forming a protective liner layer on at least the memory structures. The method further comprises disposing isolating material in the opening and on the protective liner layer. The method even further comprises removing the isolating material on the protective liner layer. The method additionally comprises removing the protective liner layer on the memory structures. Associated devices and systems are also disclosed.

Figure 2:
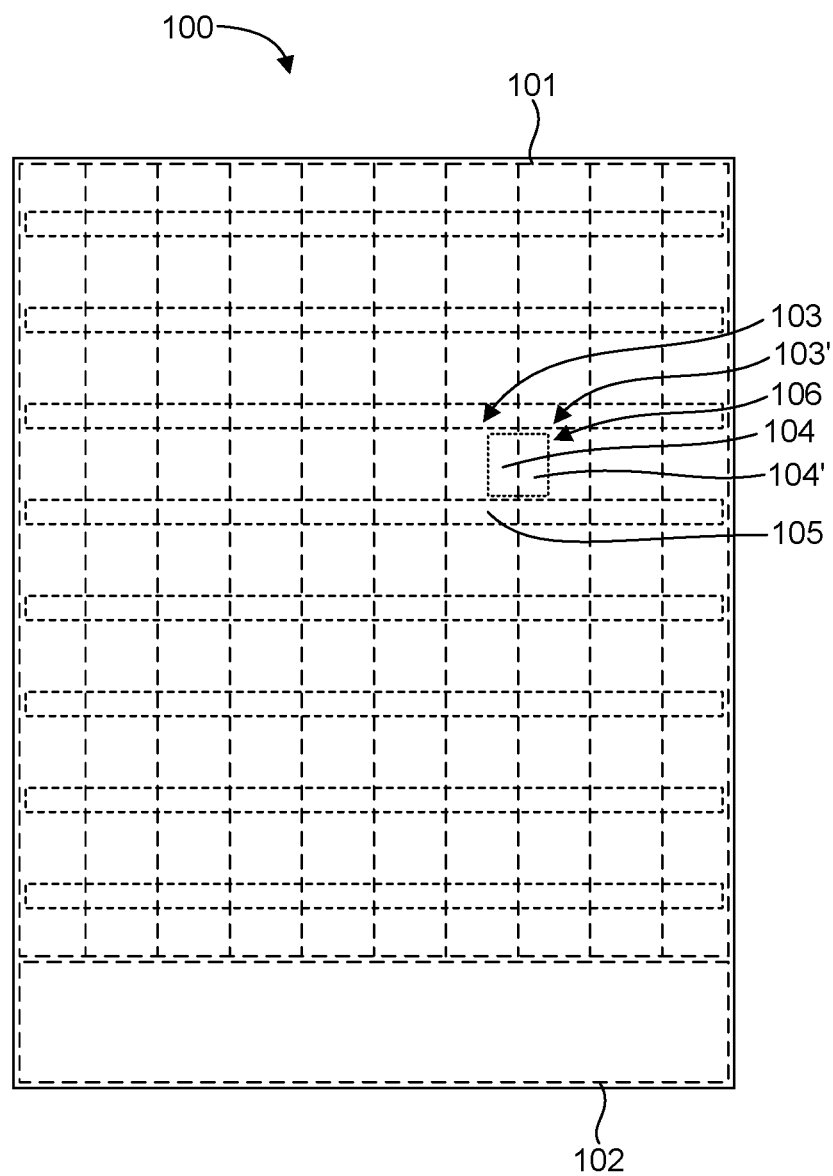
FIG. 2 illustrates a general layout of the computer memory device of FIG. 1 in accordance with an example.

Referring to FIG. 1, a schematic representation of a side view of a computer memory device 100 is illustrated. The computer memory device 100 can be, for example, a non-volatile memory device, such as a solid state memory device (e.g., a memory device such as a three-dimensional NAND memory device). An example of a general layout or arrangement of the computer memory device 100 is illustrated in FIG. 2. In this case, the computer memory device 100 is configured as a solid state memory component. This plan view shows memory array regions (i.e., a general or global memory array region indicated generally at 101) and a periphery (i.e., a global periphery portion or region indicated generally at 102). The general memory array region 101 is subdivided or segmented into blocks of memory, with each block having a local or block memory array and a staircase. A staircase facilitates electrical connections to word lines connected to memory cells in a local or block memory array. For example, a typical memory block 103 includes a local or block memory array portion or region 104 and a staircase portion or region 105. Indicated at 106 is a region where adjacent memory blocks 103, 103' are separated from one another such that adjacent memory array portions 104, 104', for example, can function independently. Such a separation region is illustrated in FIG. 1.

With further reference to FIG. 1, the computer memory device 100 can include one or more conductive structures 110 and one or more memory structures 120a-d. The memory structures 120a-d are represented generically and may be, for example, memory "pillars" each having a plurality of memory cells affiliated therewith. The computer memory device 100 may include one or more conductive structures 110 directly or indirectly connected to and in communication with (e.g., in electrical communication with, in direct or indirect contact with) one or more memory structures 120a-d. It is noted that while conductive structures and memory structures described herein may make specific reference to a NAND device, the disclosure is not so limited and may be applied to other memory devices.

The conductive structure 110 can include one or more interconnects to electrically couple the conductive structure 110 to the memory structures 120 (e.g., memory cells), a CMOS device, etc. The interconnect may be formed from any suitable conductive material such as, for example, a metal (e.g., W, Ni, tantalum nitride (TaN), Pt, tungsten nitride (WN), Au, titanium nitride (TiN), or titanium aluminum nitride (TiAlN)), polysilicon, other conductive materials, or combinations thereof. Although not shown in FIG. 1, staircase contacts in a staircase region may be in electrical communication with the conductive structure 110.

In one aspect, the memory structures 120a-d can be disposed in a semiconductor composite material 130, which can include conductive layers 131 and insulating layers 132. Each conductive layer 131 may be used to form a conductive connection (e.g., word line connection, control gate) in the memory array, although the disclosure is not so limited. Each conductive layer 131 may, for example, be a substantially planar conductive layer. The conductive layers can be formed from any suitable conductive material, such as polysilicon, tungsten, nickel, titanium, platinum, aluminum, gold, tungsten nitride, tantalum nitride, titanium nitride, other conductive materials, or combinations thereof. Each conductive layer can be separated from an adjacent conductive layer by an insulating layer 132. The insulating layers can be formed from any suitable insulative material, such as an oxide material, a nitride material, other insulative materials, or combinations thereof. In some embodiments, one or more of the conductive layers can be electrically coupled to ground. Alternating conductive layers 131 and insulating layers 132 may be formed over a substrate 133 by conventional methods. The substrate over which the conductive layers 131 and insulating layers 132 are formed may be any substantially planar material. By way of a non-limiting example, the substrate may be a semiconductor material and may include at least portions of circuits to which transistors of a memory array may be connected via the conductive structure 110.

The computer memory device 100 can include an isolating material 140 disposed between adjacent blocks of memory structures. For example, memory structures 120a-b can be included in one memory block (e.g., memory block 103 of FIG. 2) and memory structures 120c-d can be included in another memory block (e.g., memory block 103' of FIG. 2). The isolating material 140 can serve to separate and isolate one memory block from another so that each memory block can operate independently. In one aspect, the isolating material 140 can extend through the conductive layers 130. Thus, the isolating material 140 can separate portions of conductive layers in adjacent blocks of the memory array from one another. Generally, the conductive layer portions referred to herein are in memory blocks unless otherwise specified.

The isolating material 140 can have any suitable configuration. Typically, the isolating material 140 will have a wall configuration. The isolating material 140 can be formed from any suitable insulative material, such as an oxide material (e.g., low dielectric oxides), a nitride material, other insulative materials, or combinations thereof. In addition, or as an alternative, the isolating material 140 can be formed of any suitable conductive or semiconductor material (e.g., polysilicon, metal materials (such as tungsten, nickel, titanium, platinum, aluminum, gold, tungsten nitride, tantalum nitride, titanium nitride), etc.).

The computer memory device 100 can also include a protective liner layer 150 disposed between and in contact with the semiconductor composite material 130 and the isolating material 140. In one aspect, the protective liner layer 150 can be in contact with a bottom surface 141 of the isolating material 140. The protective liner layer 150 can have any suitable thickness. In one aspect, the protective liner layer 150 can have a bottom and/or a side thickness 151a, 151b, respectively, greater than or equal to 2 nm. In another aspect, the protective liner layer 150 can have a bottom and/or a side thickness 151a, 151b less than or equal to 100 nm. The protective liner layer 150 can be formed from any suitable protective material, such as an oxide material (e.g., high dielectric constant oxides), a nitride material (e.g., high dielectric constant nitrides), high dielectric constant materials, other insulative materials, materials that can be a diffusion barrier to the isolating material 140, or combinations thereof. In some embodiments, the protective liner layer 150 comprises SiNx, SiONx, AlOx, AlNx, and/or AlONx. In one aspect, the protective liner layer 150 can contribute to separating and isolating adjacent memory blocks from one another.

FIGS. 3A-3D illustrate aspects of exemplary methods or processes for isolating computer memory blocks in a memory array from one another, such as memory blocks of the computer memory device 100 shown and described in FIGS. 1 and 2.

Figure 3A:
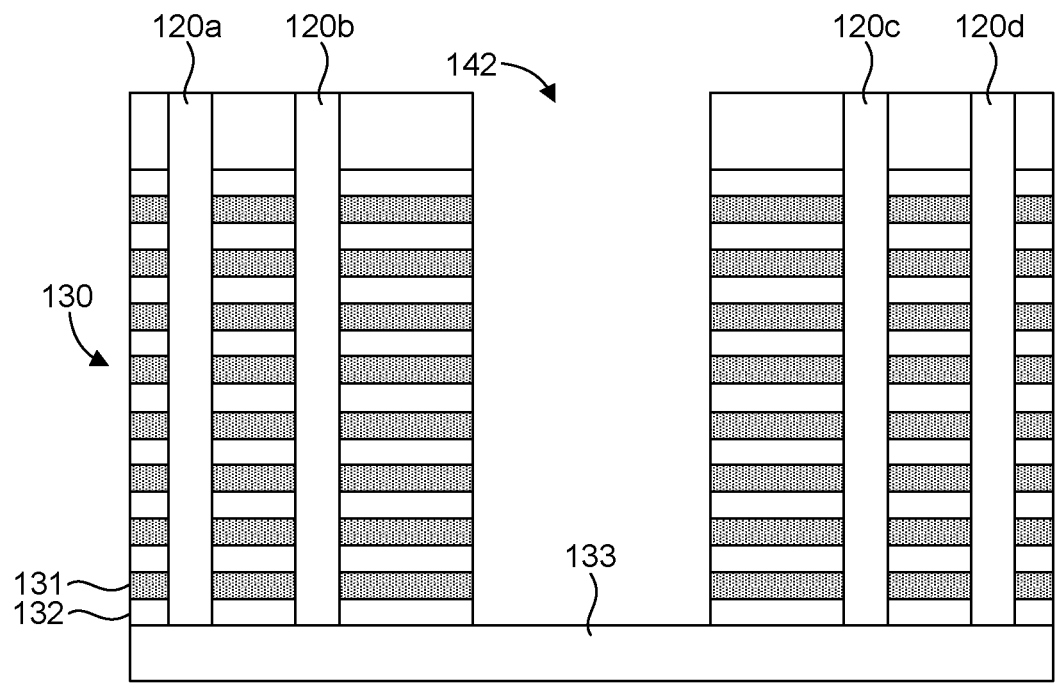
FIGS. 3A-3D illustrate a method for isolating computer memory blocks in a memory array from one another in accordance with an example.

FIG. 3A schematically illustrates a side cross-sectional view of memory structures 120*a-d*, which can be disposed in a semiconductor composite material 130 (e.g., conductive layers 131 and insulating layers 132). The memory structures 120*a-b* can be part of one memory block, and memory structures 120*c-d* can be part of another memory block. As shown in the figure, an opening 142 can be formed between adjacent blocks of memory structures (e.g., between the memory structure 120*b* and the memory structure 120*c*). The opening 142 can have any suitable configuration, such as a slot or a trench configuration. In some embodiments, the opening 142 can extend through the semiconductor composite material 130 (e.g., through the conductive layers 131 and insulating layers 132). The opening can terminate at or land on a suitable component, such as a substrate 133, a conductive material (e.g., an interconnect) and/or an insulative material. The opening 142 can be formed by any suitable process or technique, such as by etching (e.g., a dry etching process and/or a wet etching process).

Figure 3B:
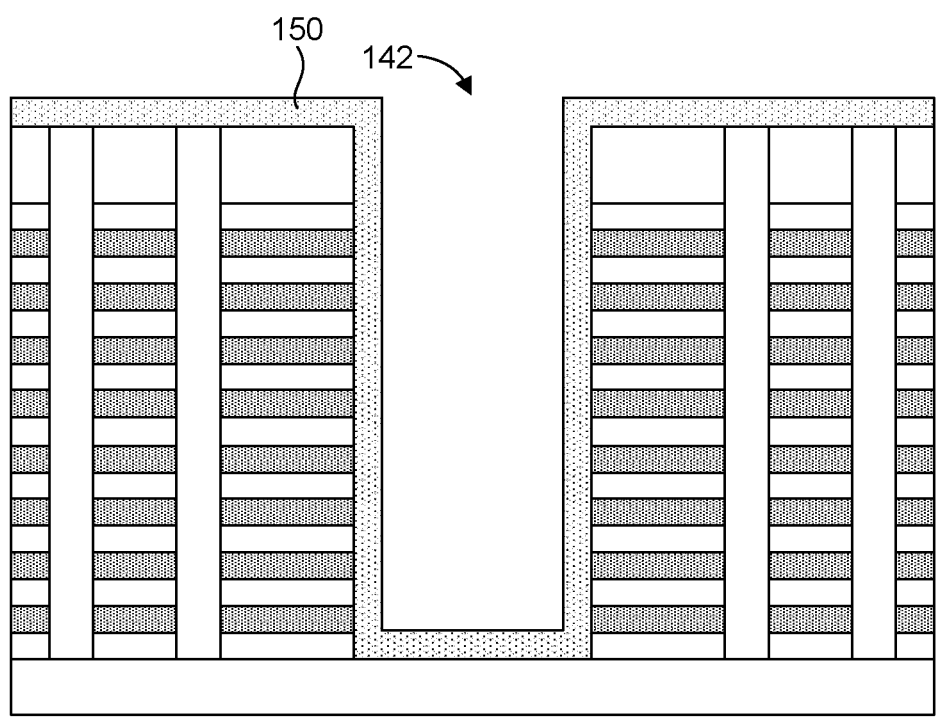
Figure 3C:
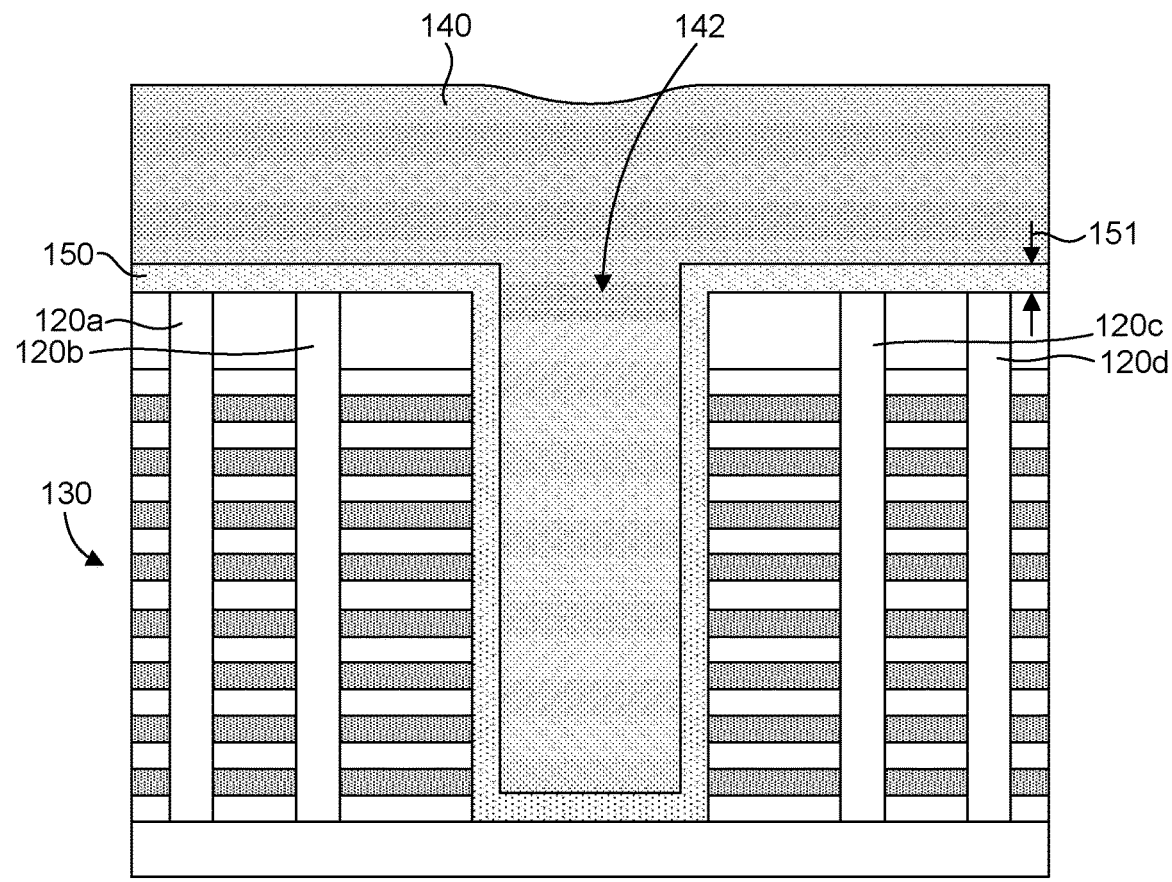

As shown in FIG. 3B, a protective liner layer 150 can be formed to protect the memory structures 120*a-d* while isolating material 140 is disposed in the opening 142 (FIG. 3C). For example, the protective liner layer 150 can be formed at least on the memory structures 120*a-d* to protect the memory structures from the isolating material 140. While forming the protective liner layer 150 on the memory structures, 120*a-d*, the protective liner layer 150 may also be formed in the opening 142 and/or in a staircase region. In other words, the protective liner layer 150 can be formed over the staircase region at the same time that the protective liner layer 150 is formed on the memory structures 120*a-d* and in the opening 142 using the same process. The protective liner layer 150 can be formed by any suitable process or technique, such as by growing, diffusing, depositing, or otherwise providing thereon. The protective liner layer 150 can be formed using, for example, deposition techniques (e.g., chemical vapor deposition (CVD), physical vapor deposition (PVD), atomic layer deposition (ALD)), oxidation processes (e.g., thermal oxidation, ISSG oxidation), and patterning techniques (e.g., masking and etching) known in the art of integrated circuit fabrication. The protective liner layer 150 can have any suitable thickness, for example, greater than or equal to 2 nm and less than or equal to 100 nm. A thicker protective liner layer 150 over the memory structures 120*a-d* can improve memory cell performance.

As shown in FIG. 3C, isolating material 140 can be disposed in the opening 142 to isolate the memory blocks from one another. While disposing isolating material 140 in the opening 142, isolating material may also be disposed on the protective liner layer 150 (e.g., over the memory structures 120*a-d* and/or in the staircase region). For example, isolating material 140 can be disposed on the protective liner layer 150 in the opening 142. In other words, the isolating material 140 can be disposed over the memory structures 120*a-d* and/or over the staircase region at the same time that isolating material is disposed in the opening 142 using the same process. The isolating material 140 can be disposed in the opening 142 and on the protective liner layer 150 by any suitable process or technique, such as by growing, diffusing, depositing, or otherwise providing thereon. The isolating material 140 can be disposed in the opening 142 and on the protective liner layer 150 using, for example, deposition techniques (e.g., chemical vapor deposition (CVD), physical vapor deposition (PVD), atomic layer deposition (ALD), sputtering, thermal evaporation, plating), oxidation processes (e.g., thermal oxidation, ISSG oxidation), and patterning techniques (e.g., masking and etching) known in the art of integrated circuit fabrication.

In one aspect, a precursor to a computer memory device can include the memory structures 120*a-d* disposed in the semiconductor composite material 130, isolating material 140 disposed between adjacent blocks of the memory structures, and the protective liner layer 150 disposed between and in contact with the semiconductor composite material 130 and the isolating material 140, as shown in FIG. 3C.

Figure 3D:
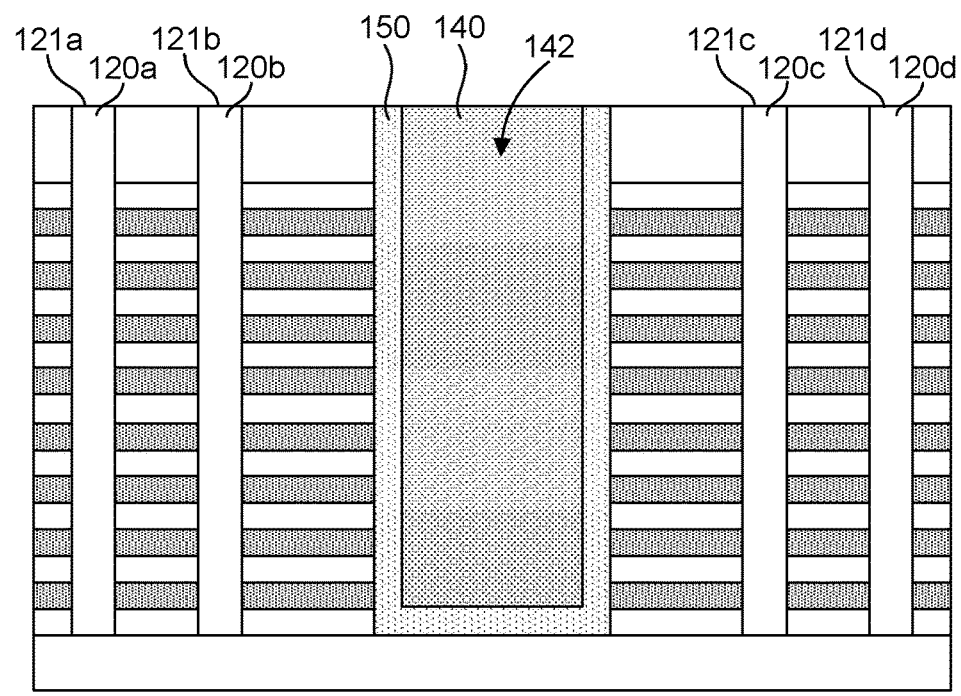

At this point, excess material can be removed, as shown in FIG. 3D. For example, portions of the isolating material 140 (e.g., on the protective liner layer 150 over the memory structures 120*a-d*, over the opening 142, and/or in the staircase region) can be removed. While removing the isolating material 140 on the memory structures 120*a-d*, the isolating material may also be removed from the staircase region. In other words, the isolating material 140 can be removed from the staircase region at the same time that the isolating material is removed from the memory structures 120*a-d* and using the same process. The isolating material 140 or portions thereof may be removed by any suitable process or technique, for example, using an abrasion or polishing process (e.g., a chemical-mechanical planarization (CMP) process, a chemical polishing process, a mechanical planarization process), an etching process, a lift-off process, or a combination thereof. Etching processes may include, for example, wet or dry etching such as removing portions of isolating material 140 using a mask and an anisotropic etching process (e.g., a reactive ion etching process, such as using a plasma) or removing portions of isolating material 140 using a mask and an isotropic process (e.g., a chemical etching process). It is noted that the particular composition of the gases used to generate the reactive ions, the particular composition of the chemical etchant, and the operating parameters of the etching process may be selected based on the composition of the mask, the material to be etched, and the surrounding materials.

In addition, portions of the protective liner layer 150 (e.g., on the memory structures 120*a-d* and/or in the staircase region) can be removed. In one aspect, while removing the protective liner layer 150 on the memory structures 120*a-d*, the protective liner layer may also be removed from the staircase region. In other words, the protective liner layer 150 can be removed from the staircase region at the same time that the protective liner layer is removed from the memory structures 120*a-d* and using the same process. The protective liner layer 150 or portions thereof may be removed by any suitable process or technique, for example, using an abrasion or polishing process (e.g., a chemical-mechanical planarization (CMP) process, a chemical polishing process, a mechanical planarization process), an etching process, a lift-off process, or a combination thereof. Etching processes may include, for example, wet or dry etching such as removing portions of protective liner layer material using a mask and an anisotropic etching process (e.g., a reactive ion etching process, such as using a plasma) or removing portions of protective liner layer material using a mask and an isotropic process (e.g., a chemical etching process). In some embodiments, portions of the isolating material 140 and portions of the protective liner layer 150 can be removed by the same process and at the same time.

Utilizing a single, relatively thick protective liner layer 150 can provide some advantages. For example, such a protective liner layer can be removed sufficient to avoid or minimize electrical contact issues with the memory structures 120a-d (e.g., exposing top surfaces 121a-d of the respective memory structures 120a-d) and in the staircase region. The single relatively thick protective liner layer 150 can therefore accomplish the competing objectives of providing adequate protection for the memory structures 120a-d as well as avoiding interference with electrical contacts with the memory structures 120a-d and in the staircase region. The single relatively thick protective liner layer 150 can also provide a cost reduction over prior multiple protective layer approaches.

In one aspect, the top surfaces 121a-d of the respective memory structures 120a-d can be exposed on a precursor to a computer memory device, as shown in FIG. 3D. Such top surfaces 121a-d may be the top surfaces of polysilicon "plugs" at the top of memory pillars.

Figure 4:
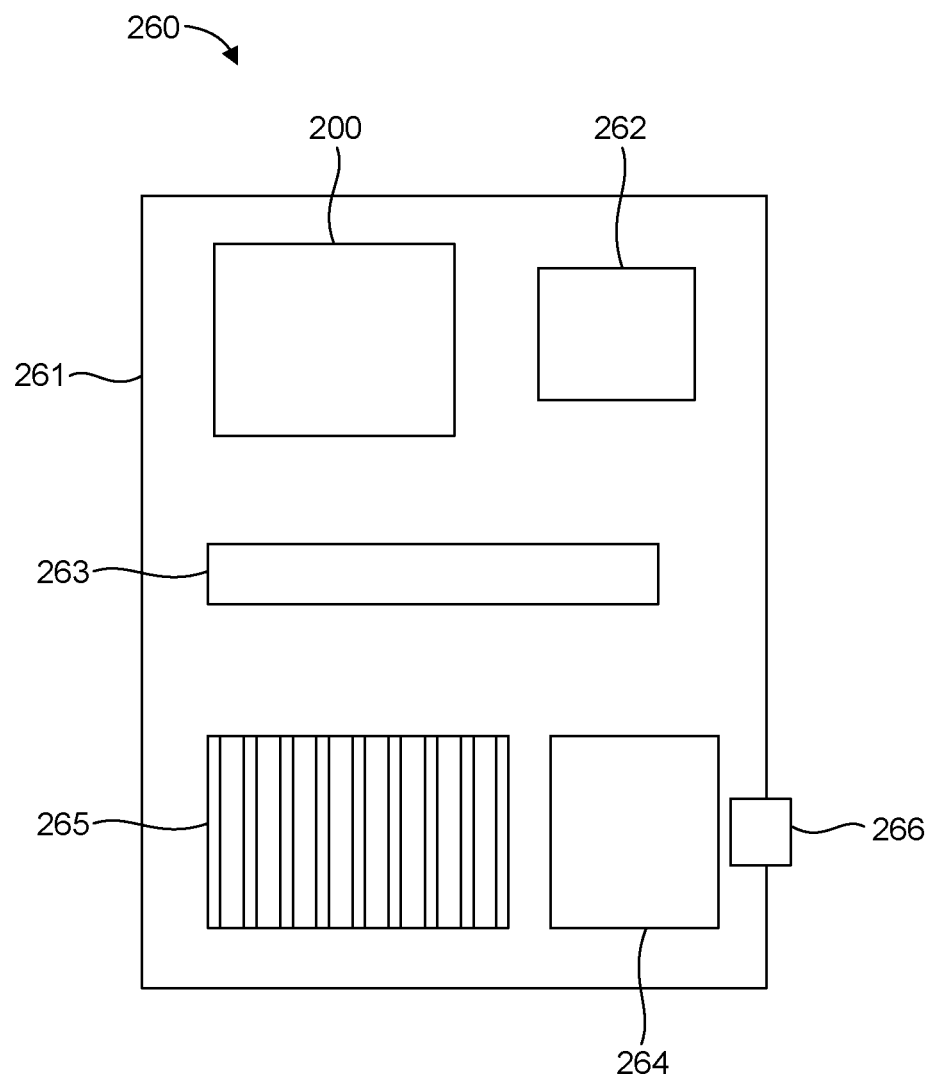
FIG. 4 is a schematic illustration of an exemplary computing system.

FIG. 4 illustrates an example computing system 260 that can include a computer memory device 200 (e.g., a solid state memory device) as disclosed herein. The computer memory device 200 can be operably coupled to a motherboard 261. In one aspect, the computing system 260 can also include a processor 262, a memory device 263, a radio 264, a heat sink 265, a port 266, a slot, or any other suitable device or component, which can be operably coupled to the motherboard 261. The computing system 260 can comprise any type of computing system, such as a desktop computer, a laptop computer, a tablet computer, a smartphone, a wearable device, a server, etc. Other embodiments need not include all of the features specified in FIG. 4, and may include alternative features not specified in FIG. 4.

EXAMPLES

The following examples pertain to further embodiments.

In one example, there is provided a method for isolating computer memory blocks in a memory array from one another comprising forming an opening between adjacent blocks of memory structures, forming a protective liner layer on at least the memory structures, disposing isolating material in the opening and on the protective liner layer, removing the isolating material on the protective liner layer, and removing the protective liner layer on the memory structures.

In one example of a method for isolating computer memory blocks in a memory array from one another, the opening comprises a slot configuration.

In one example of a method for isolating computer memory blocks in a memory array from one another, forming the opening comprises an etching process.

In one example of a method for isolating computer memory blocks in a memory array from one another, the etching process comprises a dry etching process, a wet etching process, or a combination thereof.

In one example of a method for isolating computer memory blocks in a memory array from one another, the opening extends through a semiconductor composite material.

In one example of a method for isolating computer memory blocks in a memory array from one another, the semiconductor composite material comprises a plurality of conductive layers, each conductive layer being separated from an adjacent conductive layer by an insulating layer.

In one example of a method for isolating computer memory blocks in a memory array from one another, the conductive layers comprise polysilicon, tungsten, nickel, titanium, platinum, aluminum, gold, tungsten nitride, tantalum nitride, titanium nitride, or a combination thereof.

In one example of a method for isolating computer memory blocks in a memory array from one another, the insulating layer comprises an oxide material, a nitride material, or a combination thereof.

In one example of a method for isolating computer memory blocks in a memory array from one another, forming the protective liner layer comprises a deposition process.

In one example of a method for isolating computer memory blocks in a memory array from one another, the deposition process comprises a chemical vapor deposition (CVD) process, a physical vapor deposition (PVD) process, an atomic layer deposition (ALD) process, or a combination thereof.

In one example of a method for isolating computer memory blocks in a memory array from one another, the protective liner layer is greater than or equal to 2 nm thick.

In one example of a method for isolating computer memory blocks in a memory array from one another, the protective liner layer is less than or equal to 100 nm thick.

In one example of a method for isolating computer memory blocks in a memory array from one another, the protective liner layer comprises an oxide material, a nitride material, or a combination thereof.

In one example of a method for isolating computer memory blocks in a memory array from one another, the protective liner layer comprises SiNx, SiONx, AlOx, AlNx, AlONx, or a combination thereof.

In one example, a method for isolating computer memory blocks in a memory array from one another comprises forming the protective liner layer in the opening.

In one example of a method for isolating computer memory blocks in a memory array from one another, disposing the isolating material comprises a growing process, a diffusion process, a deposition process, or a combination thereof.

In one example of a method for isolating computer memory blocks in a memory array from one another, disposing the isolating material comprises a chemical vapor deposition (CVD) process, a physical vapor deposition (PVD) process, an atomic layer deposition (ALD) process, a sputtering process, a thermal evaporation process, a plating process, or a combination thereof.

In one example of a method for isolating computer memory blocks in a memory array from one another, the isolating material comprises an oxide material, a metal material, or a combination thereof.

In one example of a method for isolating computer memory blocks in a memory array from one another, the isolating material comprises tungsten, titanium nitride, polysilicon, or a combination thereof.

In one example of a method for isolating computer memory blocks in a memory array from one another, removing the isolating material comprises an abrasion process, a polishing process, or a combination thereof.

In one example of a method for isolating computer memory blocks in a memory array from one another, removing the isolating material comprises a chemical-mechanical planarization (CMP) process, a chemical polishing process, a mechanical planarization process, an etching process, a lift-off process, or a combination thereof.

In one example of a method for isolating computer memory blocks in a memory array from one another, removing the protective liner layer comprises an abrasion process, a polishing process, or a combination thereof.

In one example of a method for isolating computer memory blocks in a memory array from one another, removing the protective liner layer comprises a chemical-mechanical planarization (CMP) process, a chemical polishing process, a mechanical planarization process, an etching process, a lift-off process, or a combination thereof.

In one example of a method for isolating computer memory blocks in a memory array from one another, the isolating material and the protective liner layer are removed in the same process.

In one example of a method for isolating computer memory blocks in a memory array from one another, forming the protective liner layer further comprises forming the protective liner layer in a staircase region.

In one example of a method for isolating computer memory blocks in a memory array from one another, disposing isolating material further comprises disposing isolating material on the protective liner layer in the staircase region.

In one example of a method for isolating computer memory blocks in a memory array from one another, removing the protective liner layer further comprises removing the protective liner layer in the staircase region.

In one example of a method for isolating computer memory blocks in a memory array from one another, the isolating material and the protective liner layer are removed in the same process.

In one example there is provided, a computer memory device precursor comprising memory structures disposed in a semiconductor composite material, an isolating material disposed between adjacent blocks of the memory structures, and a protective liner layer disposed between and in contact with the semiconductor composite material and the isolating material.

In one example of a computer memory device precursor, the protective liner layer is in contact with a bottom surface of the isolating material.

In one example of a computer memory device precursor, top surfaces of the memory structures are exposed.

In one example of a computer memory device precursor, the protective liner layer is disposed on top surfaces of the memory structures.

In one example of a computer memory device precursor, the isolating material is disposed on the protective liner layer over the memory structures.

In one example of a computer memory device precursor, the isolating material comprises a wall configuration.

In one example of a computer memory device precursor, the semiconductor composite material comprises a plurality of conductive layers, each conductive layer being separated from an adjacent conductive layer by an insulating layer.

In one example of a computer memory device precursor, the conductive layers comprise polysilicon, tungsten, nickel, titanium, platinum, aluminum, gold, tungsten nitride, tantalum nitride, titanium nitride, or a combination thereof.

In one example of a computer memory device precursor, the insulating layer comprises an oxide material, a nitride material, or a combination thereof.

In one example of a computer memory device precursor, the protective liner layer is greater than or equal to 2 nm thick.

In one example of a computer memory device precursor, the protective liner layer is less than or equal to 100 nm thick.

In one example of a computer memory device precursor, the protective liner layer comprises an oxide material, a nitride material, or a combination thereof.

In one example of a computer memory device precursor, the protective liner layer comprises SiNx, SiONx, AlOx, AlNx, AlONx, or a combination thereof.

In one example of a computer memory device precursor, the isolating material comprises an oxide material, a metal material, or a combination thereof.

In one example of a computer memory device precursor, the isolating material comprises tungsten, titanium nitride, polysilicon, or a combination thereof.

In one example of a computer memory device precursor, top surfaces of staircase contacts in a staircase region are exposed.

In one example of a computer memory device precursor, the protective liner layer is disposed on staircase contacts in a staircase region.

In one example of a computer memory device precursor, the isolating material is disposed on the protective liner layer in the staircase region.

In one example, there is provided a computer memory device comprising a conductive structure, memory structures in communication with the conductive structure, the memory structures being disposed in a semiconductor composite material, an isolating material disposed between adjacent blocks of the memory structures, and a protective liner layer disposed between and in contact with the semiconductor composite material and the isolating material.

In one example of a computer memory device, the protective liner layer is in contact with a bottom surface of the isolating material.

In one example of a computer memory device, the isolating material comprises a wall configuration.

In one example of a computer memory device, the semiconductor composite material comprises a plurality of conductive layers, each conductive layer being separated from an adjacent conductive layer by an insulating layer.

In one example of a computer memory device, the conductive layers comprise polysilicon, tungsten, nickel, titanium, platinum, aluminum, gold, tungsten nitride, tantalum nitride, titanium nitride, or a combination thereof.

In one example of a computer memory device, the insulating layer comprises an oxide material, a nitride material, or a combination thereof.

In one example of a computer memory device, the protective liner layer is greater than or equal to 2 nm thick.

In one example of a computer memory device, the protective liner layer is less than or equal to 100 nm thick.

In one example of a computer memory device, the protective liner layer comprises an oxide material, a nitride material, or a combination thereof.

In one example of a computer memory device, the protective liner layer comprises SiNx, SiONx, AlOx, AlNx, AlONx, or a combination thereof.

In one example of a computer memory device, the isolating material comprises an oxide material, a metal material, or a combination thereof.

In one example of a computer memory device, the isolating material comprises tungsten, titanium nitride, polysilicon, or a combination thereof.

In one example of a computer memory device, staircase contacts in a staircase region are in communication with the conductive structure.

In one example, there is provided a computing system comprising a motherboard, and a computer memory device operably coupled to the motherboard. The computer memory device comprises a conductive structure, memory structures in communication with the conductive structure, the memory structures being disposed in a semiconductor composite material, an isolating material disposed between adjacent blocks of the memory structures, and a protective liner layer disposed between and in contact with the semiconductor composite material and the isolating material.

In one example of a computing system, the computing system comprises a desktop computer, a laptop, a tablet, a smartphone, a wearable device, a server, or a combination thereof.

In one example of a computing system, the computing system further comprises a processor, a memory device, a heat sink, a radio, a slot, a port, or a combination thereof operably coupled to the motherboard.

Circuitry used in electronic components or devices (e.g. a die) of an electronic device package or a computer memory device can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. A method for isolating computer memory blocks in a memory array from one another, comprising:
   forming an opening between adjacent blocks of memory structures;
   forming a protective liner layer on at least a top side of the blocks of memory structures;
   disposing isolating material in the opening and on the protective liner layer on the top side of the blocks of memory structures;
   removing the isolating material on the protective liner layer on the top side of the blocks of memory structures; and
   removing the protective liner layer on the top side of the blocks of memory structures.

2. The method of claim 1, wherein the opening comprises a slot configuration.

3. The method of claim 1, wherein the opening extends through a semiconductor composite material.

4. The method of claim 1, wherein the protective liner layer is greater than or equal to 2 nm thick.

5. The method of claim 1, wherein the protective liner layer comprises an oxide material, a nitride material, or a combination thereof.

6. The method of claim 1, wherein the protective liner layer comprises SiNx, SiONx, AlOx, AlNx, AlONx, or a combination thereof.

7. The method of claim 1, further comprising forming the protective liner layer in the opening.

8. The method of claim 1, wherein disposing the isolating material comprises a chemical vapor deposition (CVD) process, a physical vapor deposition (PVD) process, an atomic layer deposition (ALD) process, a sputtering process, a thermal evaporation process, a plating process, or a combination thereof.

9. The method of claim 1, wherein the isolating material comprises an oxide material, a metal material, or a combination thereof.

10. The method of claim 1, wherein the isolating material comprises tungsten, titanium nitride, polysilicon, or a combination thereof.

11. The method of claim 1, wherein removing the isolating material comprises a chemical-mechanical planarization (CMP) process, a chemical polishing process, a mechanical planarization process, an etching process, a lift-off process, or a combination thereof.

12. The method of claim 1, wherein removing the protective liner layer comprises a chemical-mechanical planarization (CMP) process, a chemical polishing process, a mechanical planarization process, an etching process, a lift-off process, or a combination thereof.

13. The method of claim 1, wherein the isolating material and the protective liner layer are removed in the same process.

14. The method of claim 1, wherein forming the protective liner layer further comprises forming the protective liner layer in a staircase region.

15. A computer memory device, comprising:
    a conductive structure;
    a plurality of memory blocks, each memory block including:
        a semiconductor composite material; and
        at least one memory structure disposed in the semiconductor composite material and coupled to the conductive structure;
    an isolating material disposed between adjacent memory blocks; and
    a protective liner layer disposed between and in contact with the semiconductor composite material of each memory block and the isolating material between the memory blocks,
    wherein said protective liner layer terminates coplanarly with the isolating material at a top end of the memory blocks.

16. The computer memory device of claim 15, wherein the protective liner layer is in contact with a bottom surface of the isolating material.

17. The computer memory device of claim 15, wherein the isolating material comprises a wall configuration.

18. The computer memory device of claim 15, wherein the semiconductor composite material comprises a plurality of conductive layers, each conductive layer being separated from an adjacent conductive layer by an insulating layer.

19. The computer memory device of claim 18, wherein the conductive layers comprise polysilicon, tungsten, nickel, titanium, platinum, aluminum, gold, tungsten nitride, tantalum nitride, titanium nitride, or a combination thereof.

20. The computer memory device of claim 18, wherein the insulating layer comprises an oxide material, a nitride material, or a combination thereof.

21. The computer memory device of claim 15, wherein the protective liner layer is greater than or equal to 2 nm thick.

22. The computer memory device of claim 15, wherein the protective liner layer is less than or equal to 100 nm thick.

23. The computer memory device of claim 15, wherein the protective liner layer comprises an oxide material, a nitride material, or a combination thereof.

24. The computer memory device of claim 15, wherein the protective liner layer comprises SiNx, SiONx, AlOx, AlNx, AlONx, or a combination thereof.

25. The computer memory device of claim 15, wherein the isolating material comprises an oxide material, a metal material, or a combination thereof.

26. The computer memory device of claim 15, wherein the isolating material comprises tungsten, titanium nitride, polysilicon, or a combination thereof.

27. The computer memory device of claim 15, wherein staircase contacts in a staircase region are in communication with the conductive structure.

28. A computing system, comprising:
a motherboard; and
a computer memory device as recited in claim 15, operably coupled to the motherboard.

29. The system of claim 28, wherein the computing system comprises a desktop computer, a laptop, a tablet, a smartphone, a wearable device, a server, or a combination thereof.

30. The system of claim 28, further comprising a processor, a memory device, a heat sink, a radio, a slot, a port, or a combination thereof operably coupled to the motherboard.

* * * * *